United States Patent [19]

Peterson

[11] Patent Number: 4,473,761
[45] Date of Patent: Sep. 25, 1984

[54] SOLID STATE TRANSMISSION GATE

[75] Inventor: Joe W. Peterson, Austin, Tex.

[73] Assignee: Motorola, Inc., Schaumburg, Ill.

[21] Appl. No.: 371,109

[22] Filed: Apr. 23, 1982

[51] Int. Cl.³ .................. H03K 17/04; H03K 17/687; H03K 17/16
[52] U.S. Cl. .................................. 307/579; 307/585; 307/583
[58] Field of Search ............... 307/444, 481, 482, 241, 307/243, 572, 576, 579, 585, 304, 583, 584, 352, 353

[56] References Cited

U.S. PATENT DOCUMENTS

| | | | |
|---|---|---|---|
| 3,720,848 | 3/1973 | Schmidt, Jr. | 307/579 |
| 3,866,064 | 2/1975 | Gregory et al. | 307/585 |
| 4,156,153 | 5/1979 | Szecheyi | 307/585 |
| 4,319,182 | 3/1982 | Hartranft et al. | 307/584 |
| 4,430,581 | 2/1984 | Mogi et al. | 307/297 |

Primary Examiner—John S. Heyman
Assistant Examiner—Timothy P. Callahan
Attorney, Agent, or Firm—Anthony J. Sarli, Jr.; Jeffrey Van Myers; Robert L. King

[57] ABSTRACT

A solid state transmission gate having a low "on" resistance utilizes capacitive devices for partially compensating parasitic capacitance effects, a P-channel device and an N-channel device with a switched tub or substrate to compensate for parasitic capacitance effects. When the transmission gate is conducting, the tub or substrate of the N-channel device is switched from one of its current electrodes to a reference potential such as ground. Before the transmission gate is opened electrically, a settling time is provided to allow charge which is coupled from parasitic capacitance to settle.

6 Claims, 4 Drawing Figures

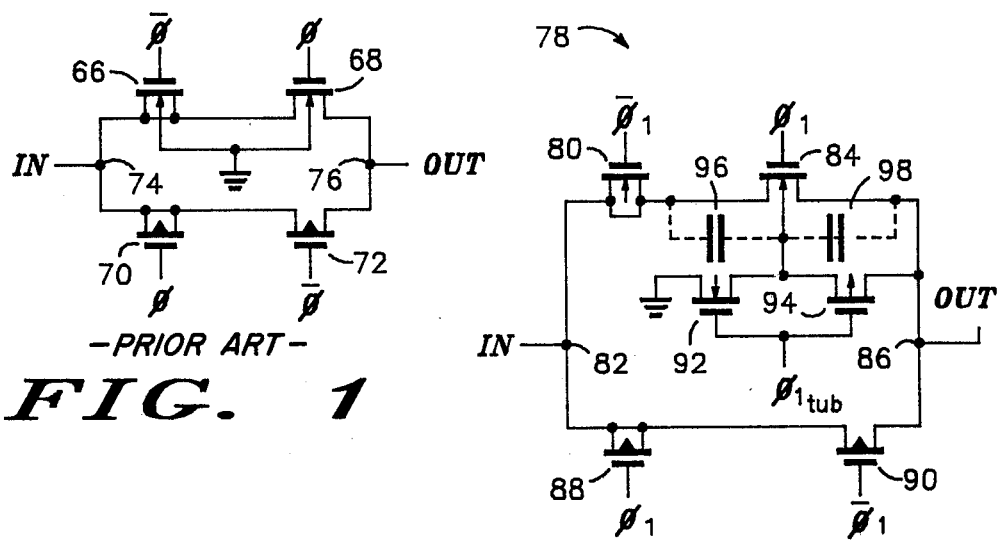
FIG. 1
FIG. 2
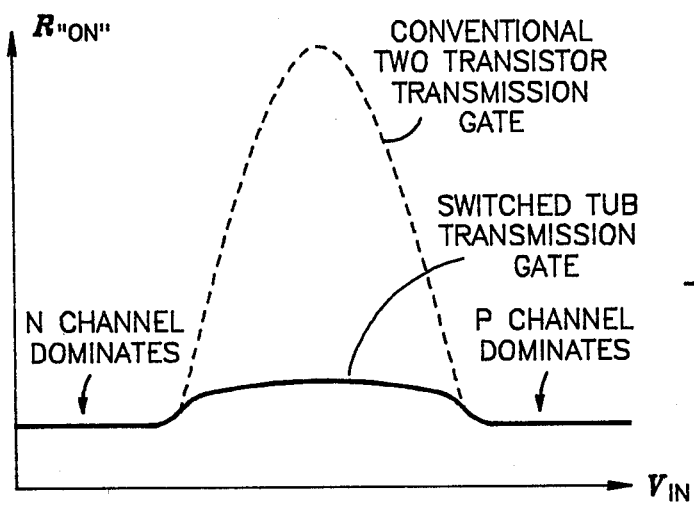
FIG. 3
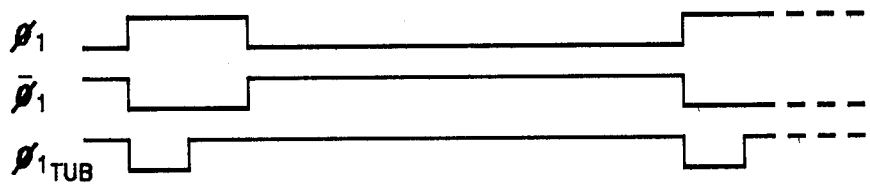
FIG. 4

SOLID STATE TRANSMISSION GATE

CROSS REFERENCE TO RELATED APPLICATIONS

Related subject matter can be found in the following copending application, assigned to the assignee hereof: U.S. patent application Ser. No. 06/371,110 entitled, "A SWITCHED CAPACITOR COMPARATOR", filed simultaneously herewith by Joe William Peterson.

TECHNICAL FIELD

This invention relates generally to solid state switches and, more particularly, to a solid state transmission gate having a switched tub transistor which substantially reduces capacitively coupled error voltages.

BACKGROUND ART

Typically, transmission gates are a source of noise and parasitics which directly produce error voltages in analog circuits. The most common source of error results from parasitic capacitance associated with transistors used to embody the transmission gate or switch. Parasitic capacitance charge couples an offset voltage to analog circuitry and exists primarily at the gate/drain and gate/source regions of transistors. A conventional CMOS analog switch utilizes a P-channel and an N-channel transistor which are clocked by complementary control signals. The two transistors are coupled in parallel. In an attempt to cancel the charge resulting from parasitic capacitance, others have used two capacitors with each having a first plate connected to an input and a second plate connected to a respective one of the two transistors. The capacitors utilize charge cancellation to limit an error voltage resulting from transients occuring during a transition of state of the control signals. However, since the capacitors cannot be perfectly matched, not all parasitic charge is effectively cancelled.

A second problem associated with transmission gates is the high "on" resistance which exists. A low resistance is desirable in order to allow coupling capacitors to quickly charge through the transmission gate. Previously, some transmission gates have utilized a "switched tub" gate as taught in U.S. Pat. No. 3,720,848 by Schmidt, Jr.. Although switching the tub or substrate of the N-channel transistor reduces the "on" resistance of the switch, the switching action may couple in electrical charge and produce an error voltage.

SUMMARY OF THE INVENTION

Accordingly, an object of the present invention is to provide an improved transmission gate having improved low error voltages while maintaining a low "on" resistance.

Another object of the present invention is to provide an improved CMOS transmission gate having minimal change in input-output resistance for variation in an input signal and having minimal offset voltage resulting from parasitic capacitance.

Yet another object of the present invention is to provide an improved transmission gate allowing faster charging times for switched capacitor circuits.

In carrying out the above and other objects of the present invention, there is provided, in one form, a transmission gate comprising two switching transistors of first and second conductivity types having the gates thereof coupled to complementary control signals. Each transistor is coupled to an input terminal via a capacitor embodied in a transistor structure having the source and drain thereof connected together for cancelling charge resulting from parasitic capacitance. Two additional transistors of the first and second conductivity type are coupled to the substrate or "tub" of the switching transistor of first conductivity type. The additional transistors are capable of switching the tub of the switching transistor of first conductivity type to an electrode of the switching transistor of first conductivity type or to a reference potential. A delay or settling time is allowed for charge existing from an inherent reverse biased diode capacitance to discharge before the switching transistors are turned "off".

The above and other objects, features and advantages of the present invention will be more clearly understood from the following detailed description taken in conjunction with the accompanying drawings.

BRIEF DESCRIPTION OF THE DRAWINGS

FIG. 1 illustrates in schematic form a transmission gate known in the prior art;

FIG. 2 illustrates in schematic form a transmission gate constructed in accordance with the preferred embodiment of the present invention;

FIG. 3 illustrates in graphical form the input-output resistance characteristic of the transmission gate of FIG. 2 as a function of input voltage; and FIG. 4 illustrates in graphical form a timing diagram for the transmission gate of FIG. 2.

DESCRIPTION OF THE PREFERRED EMBODIMENT

Shown in FIG. 1 is a CMOS transmission gate which is commonly used in the art. N-channel transistors 66 and 68 are connected in series and controlled by complementary signals $\bar{\phi}$ and $\phi$, respectively. The substrate regions of N-channel transistors 66 and 68 are connected to a ground or reference voltage potential. A drain and a source of transistor 66 are connected together in a manner so that transistor 66 functions as a capacitor to cancel charge resulting from switching transients which are coupled onto parasitic capacitance associated primarily with transistor 68. It will be understood that the source and drain electrodes of all transistors are interchangeable and that the conductivity type of all transistors may be reversed. Two series-connected P-channel transistors 70 and 72 are coupled in parallel with transistors 66 and 68. Transistors 70 and 72 are controlled by complementary signals $\bar{\phi}$ and $\phi$, respectively. A drain and a source of transistor 70 are connected together so that transistor 70 also functions as a capacitor to cancel charge resulting from switching transients which are coupled onto parasitic capacitance. A source of transistor 66 is connected to a drain of transistor 70 to form an input terminal 74. A drain of transistor 68 is connected to a source of transistor 72 to form an output terminal 76. The drain of transistor 66 is connected to a source of transistor 68, and the source of transistor 70 is connected to a drain of transistor 72. Transistors 66 and 70 are capacitive devices used to cancel switching transients created largely by parasitic gate/source and gate/drain overlap capacitances of transistors 68 and 72, respectively, which charge couple switching transients of complementary signals $\bar{\phi}$ and $\phi$.

To achieve a desired low "on" resistance, the width of the gate channels of transistors 68 and 72 must be large. However, the offset contribution of each transistor is directly proportional to the width of the transistor's gate. Therefore, the transmission gate of FIG. 1 cannot totally compensate for offset voltage and simultaneously provide a low "on" resistance.

Other transmission gates such as the solid state relay taught in U.S. Pat. No. 3,720,848 by Schmidt, Jr. have used a "switched tub" whereby the tub or substrate of the N-channel transistor of the transmission gate is switched to its source to eliminate the increase in threshold voltage and resulting increase in "on" resistance caused by a reverse source-to-substrate bias. The effect of eliminating the source-to-substrate bias is to minimize the peaking of the resistance curve. When the switch is turned off electrically, the tub of the N-channel transistor is disconnected from the source thereof and tied to a ground reference. However, switching the tub can couple in much more electrical charge than the gate/source and gate/drain parasitic overlap capacitances and thus produce a large offset voltage.

Shown in FIG. 2 is a transmission gate 78 which overcomes the disadvantages of both the transmission gate of FIG. 1 and also has advantages over the gate taught by Schmidt, Jr. in U.S. Pat. No. 3,720,848. While specific N-channel and P-channel MOS devices are shown, it should be clear that transmission gate 78 could be implemented by completely reversing the processing techniques (E.G. P-channel) or by using other types of transistors. In the preferred form, an N-channel MOS transistor 80 has a drain connected to both an input terminal 82 and the source thereof so that transistor 80 functions as a capacitor. Transistor 80 has the gate thereof coupled to a control signal $\overline{\phi_1}$ shown in FIG. 4 and the source thereof coupled to a drain of an N-channel MOS transistor 84. Transistor 84 has the gate thereof coupled to control signal $\phi_1$ and the source thereof connected to an output terminal 86. A P-channel MOS transistor 88 has the source thereof connected to both input terminal 82 and the drain of transistor 80, and the gate thereof is coupled to control signal $\phi_1$. A drain of transistor 88 is connected to both the source of transistor 88 and a source of a P-channel MOS transistor 90 so that transistor 88 also functions as a capacitor. Transistor 90 has the gate thereof coupled to control signal $\overline{\phi_1}$ and the drain thereof connected to both output terminal 86 and the source of transistor 84. It will be appreciated that transistor 84 may be fabricated with a diffused region or "tub" in a substrate material of opposite conductivity type. An N-channel MOS transistor 92 has the drain thereof connected to both the tub or substrate of N-channel transistor 84 and to the drain of a P-channel MOS transistor 94. Transistors 92 and 94 have the gates thereof connected together and coupled to a control signal $\phi 1_{tub}$ also shown in FIG. 4. A source of transistor 92 is connected to ground potential, and the source of transistor 94 is connected to both output terminal 86 and the source of transistor 84. It will also be appreciated that a substantial inherent reverse bias diode capacitance is associated with transistor 84 between a P(−) tub and an N(+) source/drain diffusion. This is shown as a parasitic capacitor 96 between the drain and substrate of transistor 84 and a parasitic capacitor 98 between the source and substrate of transistor 84.

In operation, when control signal $\phi_1$ is at a high logic level, the complement $\overline{\phi_1}$ is at a low level and transistors 84 and 90 are turned "on" and electrically closed. Transistors 80 and 88 will conduct continuously and serve only to cancel switching transients coupled by parasitic gate overlap capacitances. Simultaneously, as shown in FIG. 4, control signal $\phi 1_{tub}$ is at a low logic level. Therefore transistor 94 is "on" and transistor 92 is "off" so that the substrate or tub of transistor 84 is connected to output terminal 86. As a result, a low impedance path is provided to charge reverse bias diode capacitors 96 and 98 and any attached load capacitance (not shown). When control signal $\phi 1_{tub}$ changes state, control signal $\phi_1$ remains the same at a high logic level. Therefore, transistor 92 is now "on" and transistor 94 is "off" so that the tub has been switched from the source of transistor 84 to ground potential. However, transmission gate 78 is still "on" since signal $\phi_1$ keeps transistors 84 and 90 "on". Because the drain to tub capacitance of transistor 84 represented by capacitor 96 is substantial, switching the tub can cause a substantial offset voltage thru charge coupling. This is because charge on capacitor 96 is porportional to the capacitance and voltage associated with capacitor 96. When the voltage potential across capacitor 96 is changed by the switching action, the charge on capacitor 96 also changes. However, a settling time or delay is allowed for the charge on capacitor 96 to discharge thru a relatively high impedance output path. The high impedance output path is through transistors 84 and 90 to output terminal 86 which generally will have a low impedance output load coupled thereto. After the charge created from switching the tub of transistor 84 has been substantially dissipated, signal $\phi_1$ goes to a low logic level and transmission gate 78 turns "off".

It will be appreciated that use of the sequentially switched tub N-channel transistor 84 has substantially reduced the "on" resistance of transmission gate 78 as shown in FIG. 3. For low input voltages, the resistance characteristic is dominated by N-channel transistor 84. For high input voltages, the resistance characteristic is dominated by P-channel transistor 90. Sequentially switching the tub of N-channel transistor 84 effectively lowers the "on" resistance of gate 78 as shown by the solid curve in FIG. 3. The lower "on" resistance results from eliminating the source-to-substrate back bias. Therefore the total width of the gate electrodes of all the transistors may also be greatly reduced. As a result, undesirable parasitic charge resulting from gate/drain and gate/source overlap capacitances which are coupled to analog circuitry (not shown) as an offset voltage is substantially reduced. By delaying control signals $\phi_1$ and $\overline{\phi_1}$ until the charge has decayed, the parasitic charge coupling attributed to switching the tub is eliminated. The invention may be practiced without utilizing capacitor connected transistors 80 and 88. However, the use of capacitor connected transistors 80 and 88 further enhances the low voltage error characteristics.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:
1. A solid state transmission gate comprising:
two transistors, the first of said transistors being of a first conductivity type having first and second current electrodes and the second of said transistors being of a second conductivity type having first and second current electrodes, the first and second current electrodes of different transistors being interconnected at an input and an output terminal such that said transistors are connected in parallel, each of said transistors having a control electrode; and means for selectively shorting the substrate of one of said transistors firstly to its first current electrode for a predetermined portion of time whenever both of said transistors are rendered conducting by the simultaneous application of control electrode signals of appropriate amplitudes and polarities to the control elctrodes of said transistors, and secondly to a reference voltage for the remainder of time when both of said transistors are rendered conducting, whereby the variation of resistance across said transmission gate is minimized with respect to variations in an input signal applied to said transmission gate while error voltages created from parasitic capacitances are minimized.

2. The solid state transmission gate of claim 1 further comprising:
a third transistor of said first conductivity type coupled between said input terminal and said first transistor, having first and second current electrodes connected together, and a control electrode coupled to the same control electrode signal which is coupled to said second transistor; and
a fourth transistor of said second conductivity type coupled between the input terminal and the second transistor having first and second current electrodes connected together, and a control electrode coupled to the same control electrode signal which is coupled to said first transistor.

3. The solid state transmission gate of claims 1 or 2 wherein said means include:
a fifth transistor of said second conductivity type having a first current electrode coupled to the first current electrode of said first transistor, a second current electrode coupled to the substrate of said first transistor, and a control electrode; and
a sixth transistor of said first conductivity type having a first current electrode coupled to said reference voltage, a second current electrode coupled to both the substrate of said first transistor and the second current electrode of said fifth transistor, and a control electrode coupled to both the control electrode of said fifth transistor and a substrate control signal, for selectively switching the substrate of said first transistor from the first current electrode thereof to the reference voltage before said transmission gate stops conducting.

4. The solid state transmission gate of claim 3 further comprising:

clock means for providing gate and substrate control signals to said first, second, third, fourth, fifth and sixth transistors which selectively make the transmission gate conductive while shorting the substrate of said first transistor to its source region and then shorting said substrate to said reference voltage for a predetermined amount of time before making said transmission gate nonconductive.

5. A CMOS analog switch comprising:
a first N-channel transistor having a first current electrode coupled to an output terminal, a control electrode coupled to a control electrode signal, and a second current electrode;
a second N-channel transistor having a first current electrode coupled to an input terminal, a second current electrode coupled to both the first current electrode of said second N-channel transistor and the second current electrode of said first N-channel transistor, and a control electrode coupled to the complement of said control electrode signal;
a first P-channel transistor having a first current electrode coupled to both said output terminal and the first current electrode of said first N-channel transistor, a control electrode coupled to the complement of said control electrode signal, and a second current electrode;
a second P-channel transistor having a first current electrode coupled to both said input terminal and the first current electrode of said second N-channel transistor, a second current electrode coupled to the second current electrode of said first P-channel transistor and a control electrode coupled to the control electrode signal, wherein the improvement comprises:
means for selectively shorting the substrate of said first N-channel transistor firstly to its first current electrode for a predetermined portion of time when said first N-channel and first P-channel transistors are rendered conductive by said control electrode signal, and secondly to a ground reference voltage before said first N-channel and P-channel transistors are rendered nonconductive.

6. The CMOS analog switch of claim 5 wherein said means comprise:
a third P-channel transistor having a first current electrode coupled to the first current electrode of said first N-channel transistor, a second current electrode coupled to the substrate of said first N-channel transistor, and a control electrode coupled to a substrate control signal; and
a third N-channel transistor having a first current electrode coupled to the substrate of said first N-channel transistor, a second current electrode coupled to said ground reference voltage, and a control electrode coupled to both the control electrode of said third P-channel transistor and said substrate control signal.

* * * * *